(12) United States Patent
Sato et al.

(10) Patent No.: US 8,030,109 B2
(45) Date of Patent: Oct. 4, 2011

(54) SEMICONDUCTOR LIGHT EMITTING DEVICE, METHOD OF MANUFACTURING SAME, AND OPTICAL MODULE

(75) Inventors: Yasuo Sato, Kanagawa (JP); Jugo Mitomo, Kanagawa (JP); Mikihiro Yokozeki, Kanagawa (JP); Tomonori Hino, Kanagawa (JP); Hironobu Narui, Kanagawa (JP)

(73) Assignee: Sony Corporation, Tokyo (JP)

( * ) Notice: Subject to any disclaimer, the term of this patent is extended or adjusted under 35 U.S.C. 154(b) by 239 days.

(21) Appl. No.: 12/540,609

(22) Filed: Aug. 13, 2009

(65) Prior Publication Data

US 2010/0009485 A1   Jan. 14, 2010

Related U.S. Application Data

(62) Division of application No. 11/276,088, filed on Feb. 14, 2006, now abandoned.

(30) Foreign Application Priority Data

Feb. 18, 2005  (JP) .................................. 2005-042771

(51) Int. Cl.
    *H01L 21/00*  (2006.01)
(52) U.S. Cl. .................................. 438/46; 257/E33.028
(58) Field of Classification Search .................... 438/46; 257/E33.028
    See application file for complete search history.

(56) References Cited

U.S. PATENT DOCUMENTS

| | | | |
|---|---|---|---|
| 5,821,603 A * | 10/1998 | Puntambekar | ................ 257/640 |
| 6,150,677 A | 11/2000 | Tanaka et al. | |
| 2002/0158249 A1 | 10/2002 | Tsuda et al. | |
| 2002/0179929 A1 | 12/2002 | Takahashi et al. | |

FOREIGN PATENT DOCUMENTS

| JP | 08-195522 | 7/1996 |
| JP | 1999-274083 | 10/1999 |
| JP | 2004-072070 | 4/2004 |
| JP | 2004-006483 | 8/2004 |
| JP | 2005-038995 | 10/2005 |

OTHER PUBLICATIONS

Saito et al. "Hydogen reduction in GaAsN thin film by flow rate modulated chemical beam epitaxy," Thin Solin Films, vol. 516, p. 3517-3520, 2008.*

Japanese Office Action dated Apr. 21, 2010 for Japanese Application No. 2005-042771.

Japanese Office Action for Application No. 2005-042771 dated Sep. 27, 2010.

* cited by examiner

Primary Examiner — Matthew Reames
(74) Attorney, Agent, or Firm — SNR Denton US LLP

(57) ABSTRACT

A semiconductor light emitting device capable of realizing a long life, and a method of manufacturing the same. The impurity concentration of hydrogen in the active layer is $3 \times 10^{19}$ cm$^{-3}$ or less, and the impurity concentration of aluminum in the active layer is $1 \times 10^{18}$ cm$^{-3}$ or less. Thereby, the operating current is inhibited from increasing, and a long life can be realized.

5 Claims, 6 Drawing Sheets

SEMICONDUCTOR LIGHT EMITTING DEVICE, METHOD OF MANUFACTURING SAME, AND OPTICAL MODULE

CROSS REFERENCES TO RELATED APPLICATIONS

This application is a division of U.S. patent application Ser. No. 11/276,088, filed Feb. 14, 2006, the entirety of which is incorporated herein by reference to the extent permitted by law. The present invention claims priority to Japanese Patent Application JP 2005-042771 filed in the Japanese Patent Office on Feb. 18, 2005, the entire contents of which being incorporated herein by reference.

BACKGROUND OF THE INVENTION

The present invention relates to a semiconductor light emitting device in which an active layer includes a well layer made of a compound semiconductor containing at least gallium (Ga), arsenic (As), and nitrogen (N), a method of manufacturing the semiconductor light emitting device, and an optical module.

In these years, since information volume has been increased and communication speed has become high, optical communication using optical fiber has been increasingly demanded. Accordingly, development of light emitting devices for optical communication in 1.3 μm band or 1.5 μm band, in which transmission loss of optical fiber is low has been actively implemented. Traditionally, the light emitting devices have been mainly fabricated from GaInAsP materials using an InP substrate. However, when the InP substrate is used, there has been a disadvantage that the cost is high since the substrate is expensive and a cooling system is necessary in manufacturing due to the poor temperature characteristics.

Therefore, instead of the foregoing light emitting devices, fabricating a light emitting device using GaNAs materials on a GaAs substrate has been proposed (for example, refer to Japanese Unexamined Patent Application Publication No. H06-37355). When the GaAs substrate is used as above, the substrate is not expensive, and the temperature characteristics are superior (for example, refer to "Japan Journal of Applied Physics," 2000, 6A, p. 39) and therefore a cooling system is not necessary, leading to reductions in cost.

SUMMARY OF THE INVENTION

However, there has been a disadvantage that when the GaNAs materials are used, it is difficult to form favorable crystal and the life is short.

In view of such a disadvantage, in the present invention, it is desirable to provide a semiconductor light emitting device capable of realizing a long life, a method of manufacturing the same, and an optical module using it.

According to an embodiment of the present invention, there is provided a semiconductor light emitting device in which an active layer has a well layer made of a compound semiconductor containing at least gallium (Ga), arsenic (As), and nitrogen (N), wherein impurity concentration of hydrogen (H) in the active layer is $3\times10^{19}$ cm$^{-3}$ or less, and the impurity concentration of aluminum (Al) in the active layer is $1\times10^{18}$ cm$^{-3}$ or less, or the impurity concentration of hydrogen in the active layer is $1.5\times10^{18}$ cm$^{-3}$ or less, and the impurity concentration of aluminum in the active layer is $4\times10^{18}$ cm$^{-3}$ or less.

According to an embodiment of the present invention, there is provided a method of manufacturing a semiconductor light emitting device, in which an active layer has a well layer made of a compound semiconductor containing at least gallium, arsenic, and nitrogen, wherein an organic nitrogen compound is used as a raw material of nitrogen when forming the active layer, the flow rate of the organic nitrogen compound is 135 cm$^3$/min or less, and thereby the impurity concentration of hydrogen in the active layer becomes $3\times10^{19}$ cm$^{-3}$ or less.

According to an embodiment of the present invention, there is provided an optical module including a semiconductor light emitting device, wherein in the semiconductor light emitting device, an active layer has a well layer made of a compound semiconductor containing at least gallium, arsenic, and nitrogen, the impurity concentration of hydrogen in the active layer is $3\times10^{19}$ cm$^{-3}$ or less, and the impurity concentration of aluminum (Al) in the active layer is $1\times10^{18}$ cm$^{-3}$ or less, or the impurity concentration of hydrogen in the active layer is $1.5\times10^{18}$ cm$^{-3}$ or less, and the impurity concentration of aluminum in the active layer is $4\times10^{18}$ cm$^{-3}$ or less.

According to the semiconductor light emitting device and the optical module of the embodiment of the present invention, the impurity concentration of hydrogen in the active layer is $3\times10^{19}$ cm$^{-3}$ or less, and the impurity concentration of aluminum in the active layer is $1\times10^{18}$ cm$^{-3}$ or less, or the impurity concentration of hydrogen in the active layer is $1.5\times10^{18}$ cm$^{-3}$ or less, and the impurity concentration of aluminum in the active layer is $4\times10^{18}$ cm$^{-3}$ or less. Therefore, the life can be prolonged so that, for example, the elapsed time that the operating current is increased up to 50% or more of the initial operating current is 1000 hours or more.

In particular, when the thickness per one layer of the barrier layer in the active layer is in the range from 1 nm to 8 nm, the life can be further prolonged.

Further, according to the method of manufacturing a semiconductor light emitting device of the embodiment of the present invention, an organic nitrogen compound is used as a raw material of nitrogen when forming the active layer, the flow rate of the organic nitrogen compound is 135 cm$^3$/min or less, and thereby the impurity concentration of hydrogen in the active layer can be $3\times10^{19}$ cm$^{-3}$ or less.

Other and further objects, features and advantages of the invention will appear more fully from the following description.

DETAILED DESCRIPTION OF THE PREFERRED EMBODIMENT

Descriptions will be given of an embodiment of the present invention in detail with reference to the drawings.
(Semiconductor Light Emitting Device)

Figure 1:
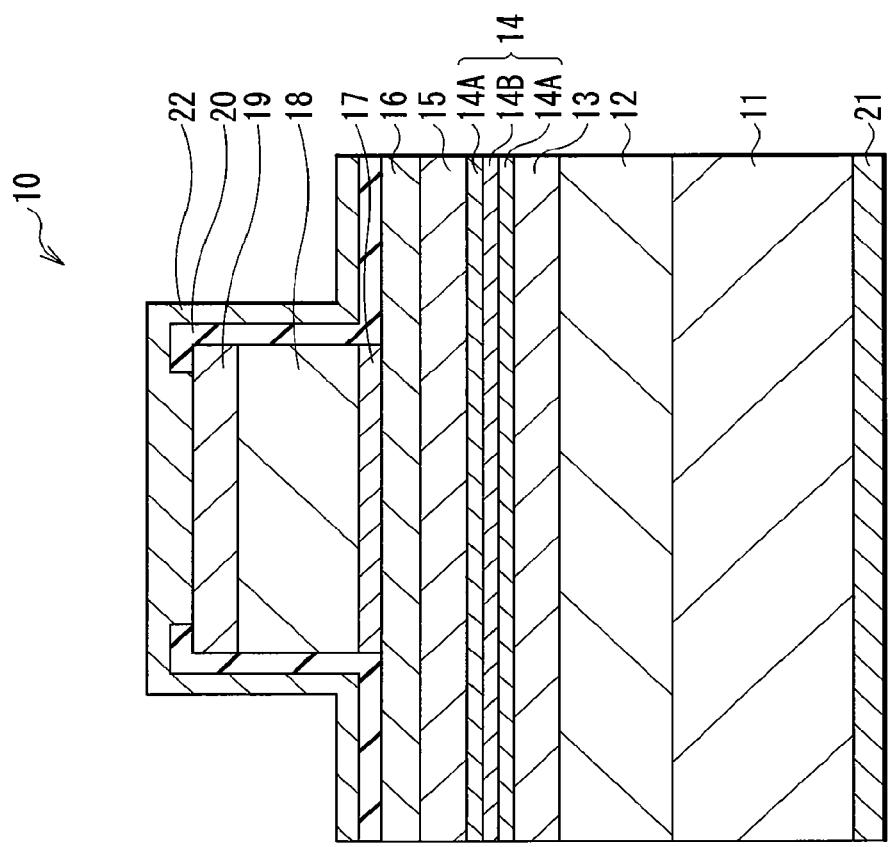
FIG. 1 is a cross section showing a structure of a laser diode according to an embodiment of the present invention.

FIG. 1 shows a cross sectional structure of a laser diode 10, which is a semiconductor light emitting device according to an embodiment of the present invention. The laser diode 10 is a long-wavelength laser with an oscillation wavelength used for communication and the like of 1.1 µm to 1.5 µm. For example, the laser diode 10 has a structure in which on the obverse side of a substrate 11, a first cladding layer 12, a first guide layer 13, an active layer 14, a second guide layer 15, a second cladding layer 16, an etching stop layer 17, a third cladding layer 18, and a contact layer 19 are layered sequentially from the substrate 11 side. The etching stop layer 17, the third cladding layer 18, and the contact layer 19 are made into a narrow stripe-shaped ridge, and an insulating layer 20 made of silicon dioxide ($SiO_2$) or the like is formed on the both sides thereof.

The substrate 11 has a thickness in the lamination direction (hereinafter simply referred to as thickness) of, for example, about 450 µm, and is made of n-type GaAs doped with an n-type impurity such as silicon (Si) and selenium (Se). The first cladding layer 12 is, for example, about 2 µm thick, and is made of an n-type $Al_{0.47}Ga_{0.53}As$ mixed crystal doped with the n-type impurity such as silicon and selenium. The first guide layer 13 is, for example, about 100 nm thick, and is made of undoped GaAs.

The active layer 14 has a multiquantum well (MQW) structure, in which a barrier layer 14B is formed between well layers 14A. While in FIG. 1, the case of double quantum well structure in which the number of the well layers 14A is two layers is shown, three or more layers may be layered. Further, though not shown, the active layer 14 may be constructed by a single quantum well (SQW) structure in which only the well layer 14A exists.

The well layer 14A functions as a light emitting layer. The region corresponding to the contact layer 19, that is, the region corresponding to the ridge in which the contact layer 19 is provided becomes a light emitting section. The well layer 14A is made of, for example, a compound semiconductor containing at least gallium of a Group 13 element in the long period periodic table, and arsenic and nitrogen of Group 15 elements in the long period periodic table. The compound semiconductor may further contain indium (In) of a Group 13 element. The compound semiconductor may furthermore include antimony (Sb) of a Group 15 element. That is, the well layer 14A is preferably made of, for example, a $Ga_{1-x}In_xN_yAs_{1-y-z}Sb_z$ mixed crystal ($0 \leq x<1$, $0<y<1$, $0 \leq z<1$, and $0<y+z<1$). The composition of the well layer 14A is adjusted according to the target light emitting wavelength.

The barrier layer 14B is made of, for example, GaAs or a compound semiconductor containing GaAs and nitrogen. That is, the barrier layer 14B is made of, for example, a $GaN_vAs_{1-v}$ mixed crystal ($0 \leq v<1$).

In this embodiment, the impurity concentration of hydrogen in the active layer 14 is $3\times10^{19}$ $cm^{-3}$ or less, and the impurity concentration of aluminum in the active layer 14 is $1\times10^{18}$ $cm^{-3}$ or less. Otherwise, the impurity concentration of hydrogen in the active layer 14 is $1.5\times10^{18}$ $cm^{-3}$ or less, and the impurity concentration of aluminum in the active layer 14 is $4\times10^{18}$ $cm^{-3}$ or less. Thereby, a long life can be realized. Hydrogen and aluminum are easily taken in as impurity by decomposition of raw materials or the like in manufacturing steps. If the impurity concentrations thereof are high, crystallinity is lowered leading to lowered characteristics, and the life is shortened.

Figure 2:
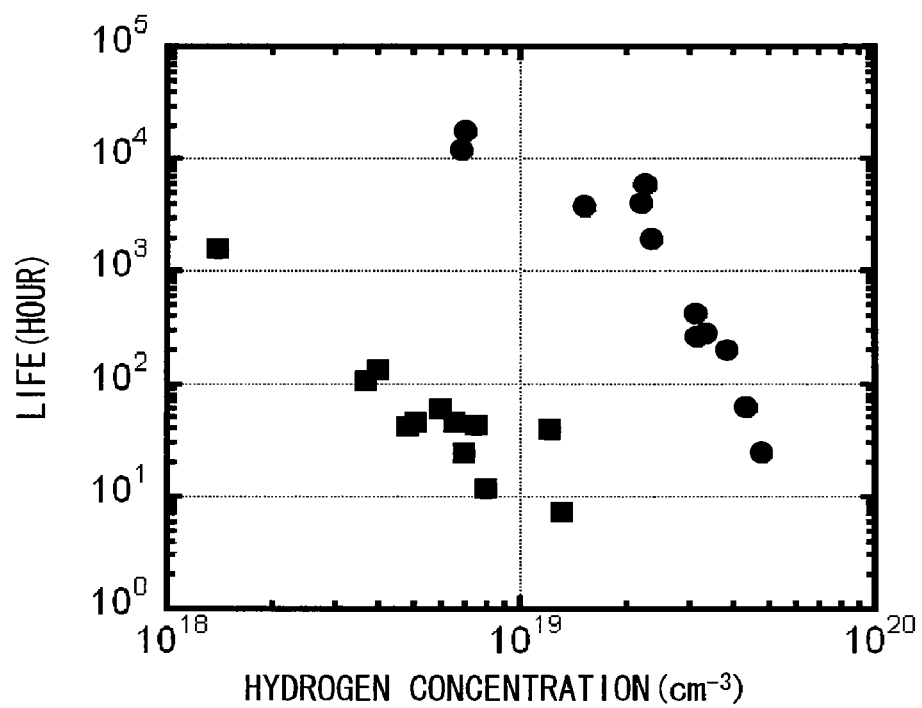
FIG. 2 is a characteristics diagram showing a relation between the hydrogen concentration in an active layer shown in FIG. 1 and the life.
Figure 3:
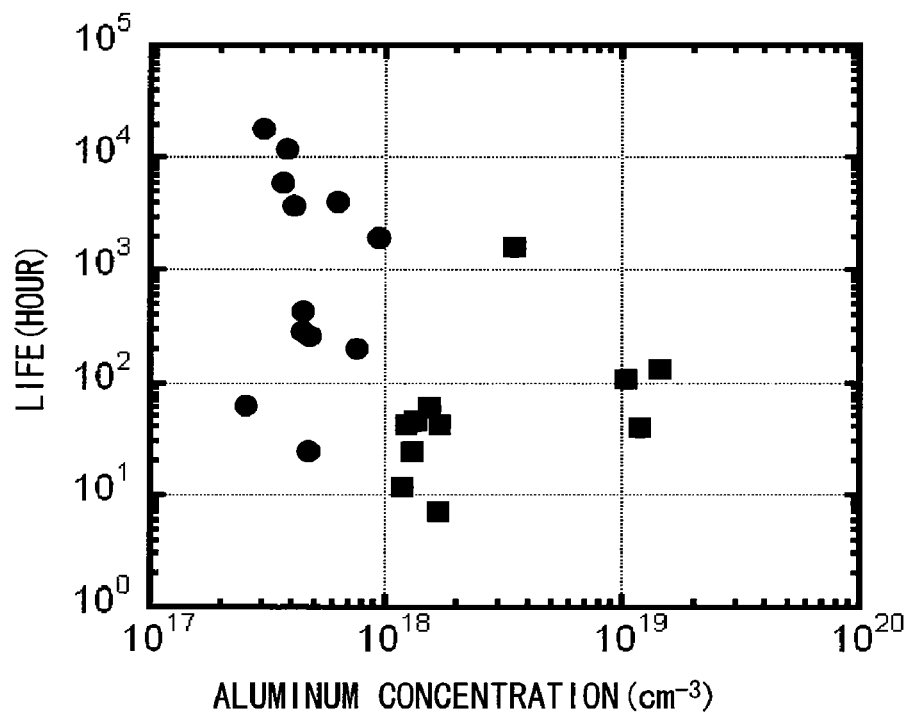
FIG. 3 is a characteristics diagram showing a relation between the aluminum concentration in the active layer shown in FIG. 1 and the life.

FIG. 2 shows a relation between the hydrogen concentration in the active layer 14 and the life. FIG. 3 shows a relation between the aluminum concentration in the active layer 14 and the life. FIGS. 2 and 3 are characteristics diagrams in the case of manufacturing semiconductor light emitting devices having the structure shown in FIG. 1 under various manufacturing conditions by MOCVD (Metal Organic Chemical Vapor Deposition) method. The hydrogen concentration was changed by changing the flow rate of an organic nitrogen compound as a nitrogen source when the active layer 14 was formed. The aluminum concentration was changed by performing a step of removing aluminum before the active layer 14 was formed. In FIGS. 2 and 3, the cases indicated by black circles were provided with the step of removing aluminum, and the cases indicated by black squares were not provided with the step of removing aluminum.

The hydrogen concentration and the aluminum concentration were measured by SIMS (Secondary Ion Mass Spectrometry) method. For the life, APC (Automatic Power control) reliability test, in which optical power was maintained at 1 mW under the environment of 25 deg C. was performed, and the elapsed time that the operating current was increased up to 50% or more of the initial operating current was measured. The life used as a target for practical application is about 1000 hours.

As shown in FIG. 2, the life tends to become longer as the hydrogen concentration becomes lower for the cases indicated by black circles and black squares, respectively. However, for the cases indicated by black squares, the life was shorter than of the cases indicated by black circles even when the hydrogen concentration was low. Further, as shown in FIG. 3, for the cases indicated by black circles provided with the step of removing aluminum, the aluminum concentration was low. However, for the cases indicated by black squares not provided with the step of removing aluminum, the aluminum concentration was high, and the life was short. That is, in view of both FIG. 2 and FIG. 3, it is found that in order to obtain a life of 1000 hours or more, the hydrogen concentration should be $3\times10^{19}$ $cm^{-3}$ or less, and the aluminum concentration should be $1\times10^{18}$ $cm^{-3}$ or less.

Further, of the cases indicated by black squares, for the case in which the hydrogen concentration was extremely low to the degree of $1.5\times10^{18}$ $cm^{-3}$ or less, the life of 1000 hours or more could be obtained. That is, it is found that when the hydrogen concentration is extremely low to the degree of $1.5\times10^{18}$ $cm^{-3}$ or less, the aluminum concentration is not necessarily $1\times10^{18}$ $cm^{-3}$ or less but may be about $4\times10^{18}$ $cm^{-3}$ or less.

Figure 4:
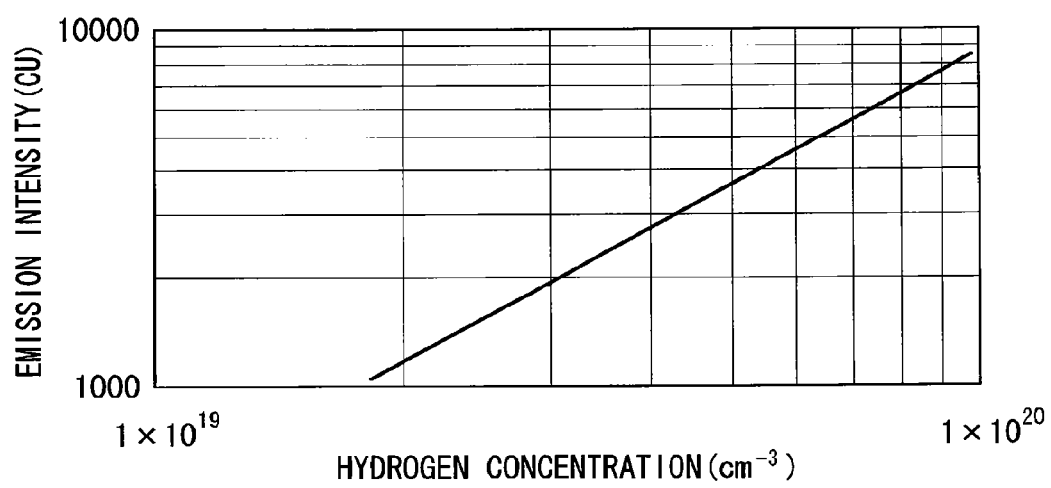
FIG. 4 is a characteristics diagram showing a relation between the hydrogen concentration in the active layer shown in FIG. 1 and the emission intensity.

FIG. 4 shows a relation between the hydrogen concentration of the active layer 14 in the semiconductor light emitting device shown in FIGS. 2 and 3 and the emission intensity. As shown in the figure, differently from the life, the emission intensity tends to be lowered as the hydrogen concentration becomes lowered. That is, it is found that if the hydrogen concentration is simply lowered, crystallinity is improved, the emission intensity is increased, and the life is prolonged. It is found that there is a specific relation between the hydrogen concentration, the aluminum concentration and the life.

The thickness of the well layer 14A is adjusted according to the target light emitting wavelength, and for example, is preferably 10 nm or more. When the thickness of the well layer 14A is increased, the quantum confinement effect in the well layer 14A is decreased and the wavelength becomes long, and therefore the nitrogen content necessary for long wavelength can be decreased. In the result, the flow rate of the organic nitrogen compound as a raw material of nitrogen can be reduced, and of the hydrogen generated by the decomposition thereof, the amount of hydrogen taken in the well layer 14A can be reduced.

Figure 5:
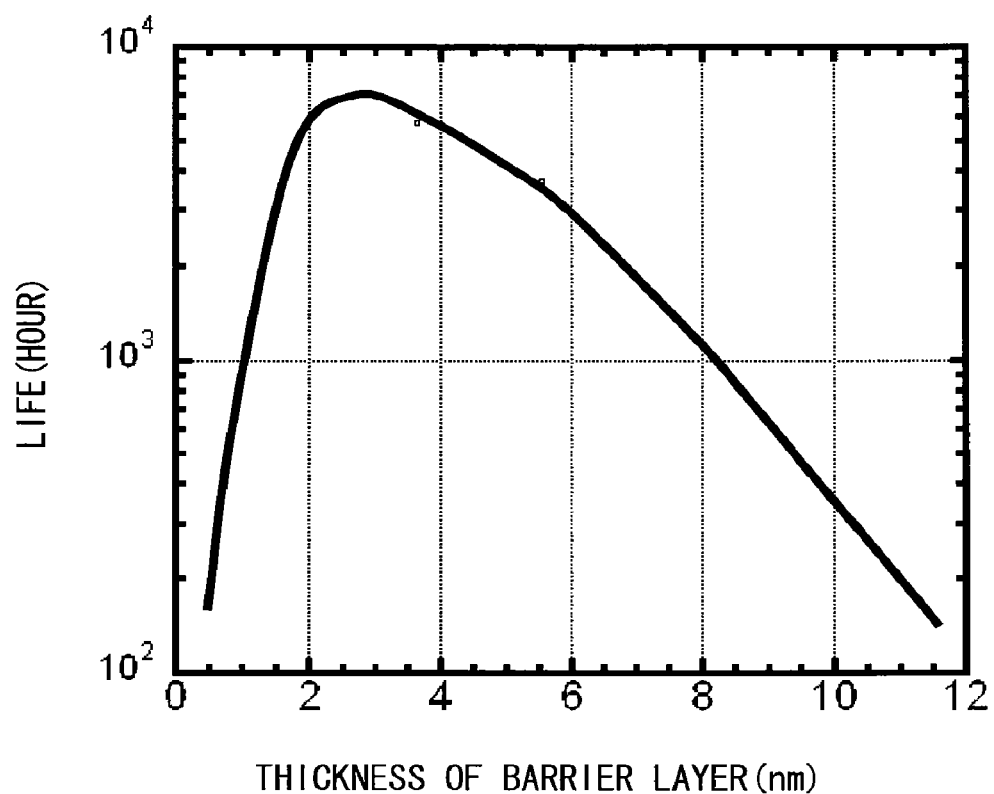
FIG. 5 is a characteristics diagram showing a relation between the thickness of a barrier layer shown in FIG. 1 and the life.

The thickness per one layer of the barrier layer 14B is preferably in the range from 1 nm to 8 nm. FIG. 5 shows a relation between the thickness per one layer of the barrier layer 14B and the life. The figure is a characteristics diagram in the case of changing the thickness of the barrier layer 14B in the semiconductor light emitting device having the structure shown in FIG. 1. For the life, as described above, APC reliability test, in which optical power was maintained at 1 mW under the environment of 25 deg C. was performed, and the elapsed time that the operating current was increased up to 50% or more of the initial operating current was measured. As shown in FIG. 5, there is a tendency that the life becomes longer as the thickness of the barrier layer 14B is increased, shows the maximum value, and then becomes short. It is found that the thickness of the barrier layer 14B is preferably in the range from 1 nm to 8 nm.

The second guide layer 15 is, for example, about 100 nm thick, and is made of undoped GaAs. The second cladding layer 16 is, for example, about 200 nm thick, and is made of a p-type $Al_{0.47}Ga_{0.53}As$ mixed crystal doped with the p-type impurity such as zinc (Zn). The etching stop layer 17 is, for example, about 30 nm thick, and is made of a p-type GaAs doped with the p-type impurity such as zinc. The third cladding layer 18 is, for example, about 1.3 μm thick, and is made of the p-type $Al_{0.47}Ga_{0.53}As$ mixed crystal doped with the p-type impurity such as zinc. The contact layer 19 is intended to obtain ohmic junction with a p-side electrode described later. The contact layer 19 is, for example, about 300 nm thick, and is made of the p-type GaAs doped with concentrated the p-type impurity such as zinc.

The laser diode 10 has an n-side electrode 21 on the reverse side of the substrate 11. The n-side electrode 21 has a structure in which, for example, a gold (Au) layer, an alloy layer of gold and germanium (Ge), and a gold layer are sequentially layered from the substrate 11 side, and the lamination is alloyed by heat treatment. The n-side electrode 21 is electrically connected to the first cladding layer 12 with the substrate 11 in between. Meanwhile, a p-side electrode 22 is provided on the contact layer 19. The p-side electrode 22 has a structure in which, for example, a titanium (Ti) layer, a platinum (Pt) layer, and a gold layer are sequentially layered from the contact layer 19 side, and the lamination is alloyed by heat treatment. The p-side electrode 22 is electrically connected to the contact layer 19.

In the laser diode 10, a pair of side faces opposed to each other, for example, in the length direction of the contact layer 19 is a pair of resonator end faces. On the pair of resonator end faces, an unshown pair of reflector films is respectively formed. The reflectance of one reflector film of the pair of reflector films is adjusted to be low, and the reflectance of the other reflector film is adjusted to be high. For example, the reflector films are preferably formed from a multilayer film in which dielectric films are layered, since the reflectance can be voluntarily adjusted. For example, the reflectance of one resonator end face is adjusted to be about 50%, and the reflectance of the other resonator end face is adjusted to be about 98%. Thereby, light generated in the active layer 14 travels between the pair of reflector films and is amplified, and is emitted as a laser beam from one reflector film.

The laser diode 10 can be manufactured, for example, as follows.

First, for example, on the obverse side of the substrate 11 made of the foregoing material having the foregoing thickness, for example, by MOCVD method, the first cladding layer 12, the first guide layer 13, the active layer 14, the second guide layer 15, the second cladding layer 16, the etching stop layer 17, the third cladding layer 18, and the contact layer 19, which respectively have the foregoing thickness and are made of the foregoing material, are layered sequentially. Then, as a raw material of gallium, trimethyl gallium, triethyl gallium or the like is used. As a raw material of aluminum, trimethyl aluminum, triethyl aluminum or the like is used. As a raw material of indium, trimethyl indium, triethyl indium or the like is used. As a raw material of arsenic, arsine, tertiary butyl arsine or the like is used. As a raw material of nitrogen, dimethyl hydrazine, monomethyl hydrazine, tertiary butyl hydrazine or the like is used. As a raw material of antimony, trimethyl antimony, dimethyl tertiary butyl antimony or the like is used.

When the active layer 14 is grown, if the foregoing organic nitrogen compound is used as a raw material of nitrogen, hydrogen generated by decomposition of the raw material is easily taken in the active layer 14, and the hydrogen concentration in the active layer 14 becomes high. Therefore, when the well layer 14A is grown, the flow rate of the organic nitrogen compound is preferably more than 0 $cm^3/min$ and equal to or less than 135 $cm^3/min$. The same applies to the barrier layer 14B. When nitrogen is to be contained in the barrier layer 14B, the flow rate of the organic nitrogen compound is preferably more than 0 $cm^3/min$ and equal to or less than 135 $cm^3/min$. Thereby, the amount of hydrogen taken in the active layer 14 can be small. The flow rate of the organic nitrogen compound is adjusted according to the amount of nitrogen contained in the well layer 14A and in the barrier layer 14B. When nitrogen is not to be contained in the barrier layer 14B, the flow rate of the organic nitrogen compound is 0 $cm^3/min$.

Figure 6:
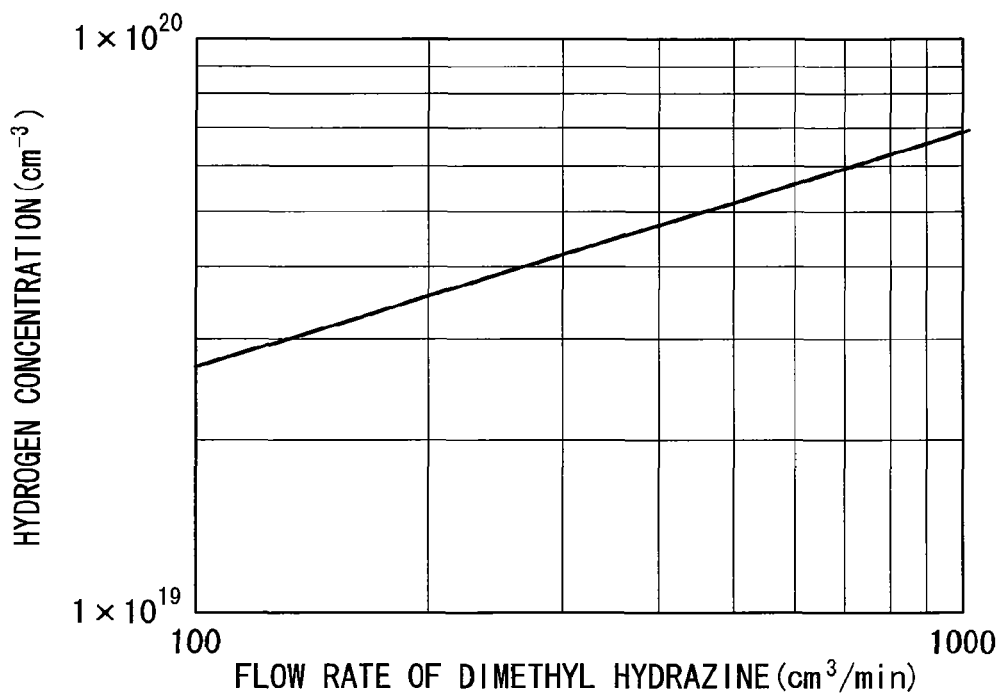
FIG. 6 is a characteristics diagram showing a relation between the flow rate of dimethyl hydrazine when a well layer shown in FIG. 1 is formed and the hydrogen concentration in the well layer.

FIG. 6 shows a relation between the flow rate of dimethyl hydrazine and the hydrogen concentration in the well layer 14A in the case of using dimethyl hydrazine as a raw material of nitrogen when the well layer 14A was formed. As shown in FIG. 6, when the flow rate of dimethyl hydrazine is 135 $cm^3/min$ or less, the impurity concentration of hydrogen in the well layer 14A can be $3\times10^{19}$ $cm^{-3}$ or less.

Figure 7:
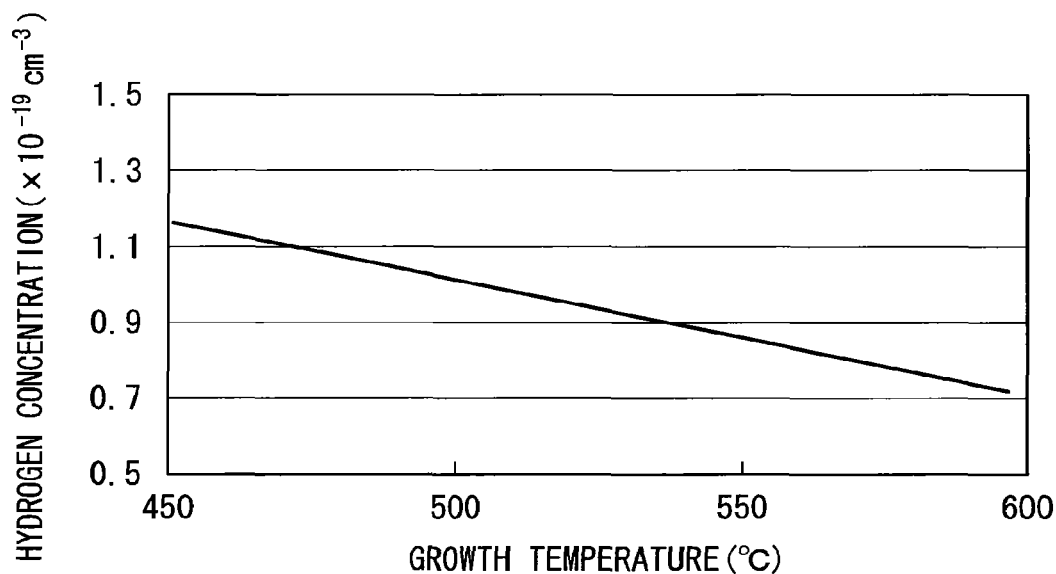
FIG. 7 is a characteristics diagram showing a relation between the growth temperature when forming the active layer shown in FIG. 1 and the hydrogen concentration in the active layer.
Figure 8:
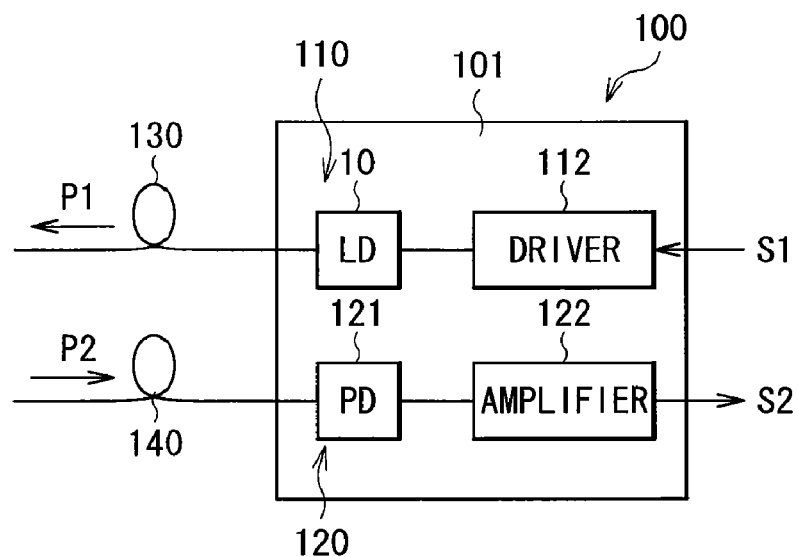
FIG. 8 is a view showing a model of a structure of an optical module including the laser diode shown in FIG. 1.

Further, the growth temperature when forming the active layer 14 is preferably in the range, for example, from 400 deg C. to 700 deg C. When the growth temperature is low, favorable crystallinity is not able to be obtained. Meanwhile, when the growth temperature is high, desorption of nitrogen is accelerated, and efficiency of taking nitrogen in the active layer 14 is decreased. However, higher growth temperatures are preferable, since the uptake amount of hydrogen can be decreased. FIG. 7 shows a relation between the growth temperature when the active layer 14 is grown and the hydrogen concentration in the active layer 14. As shown in FIG. 7, it is found that as the growth temperature becomes high, the hydrogen concentration is decreased. Therefore, the growth temperature when forming the active layer 14 is preferably in the range, for example, from 500 deg C. to 600 deg C.

Further, it is preferable that before the active layer 14 is grown, the step of removing aluminum in which gas reactive with aluminum is flowed is performed. Thereby, aluminum remaining, for example, as an attached matter inside the reaction chamber can be removed, and the impurity concentration of aluminum in the active layer 14 can be $1\times10^{18}$ cm$^{-3}$ or less. This is as described above with reference to FIG. 3. As gas reactive with aluminum, dimethyl hydrazine, ammonia, nitrogen radical obtained by decomposing nitrogen by plasma or the like can be cited. Two or more thereof can be used by mixing.

The step of removing aluminum may be performed after the layer containing aluminum is grown and before the active layer 14 is grown, in the case that there is a step of growing a layer containing aluminum such as the first cladding layer 12 before growing the active layer 14. For example, the step of removing aluminum may be performed after the first cladding layer 12 is grown and before the first guide layer 13 is grown. Otherwise, the step of removing aluminum may be performed concurrently in the step of forming the first guide layer 13. Otherwise, the step of removing aluminum may be performed after the first guide layer 13 is grown and before the active layer 14 is grown.

When the step of removing aluminum is performed after the first cladding layer 12 is grown and before the first guide layer 13 is grown, or is performed after the first guide layer 13 is grown and before the active layer 14 is grown, the gas reactive with aluminum is preferably supplied together with the raw material of the Group 15 element in a state that supply of the raw material of the Group 13 element is stopped. Thereby, reaction products containing the Group 13 element are inhibited from newly being adhered.

After each semiconductor layer is grown as above, for example, by etching, part of the etching stop layer 17, the third cladding layer 18, and the contact layer 19 is selectively removed and made into a narrow stripe-shaped ridge. After the etching stop layer 17, the third cladding layer 18, and the contact layer 19 are made into the narrow stripe-shaped ridge, the insulating layer 20 made of the foregoing material is formed on the both sides of the ridge by, for example, CVD (Chemical Vapor Deposition) method.

After the insulating layer 20 is formed, for example, the reverse side of the substrate 11 is ground to adjust the thickness of the substrate 11 to the degree of about 10 μm, and the n-side electrode 21 is formed on the reverse side of the substrate 11. Further, in the insulating layer 20, for example, by etching, an aperture is provided correspondingly to the contact layer 19, and the p-side electrode 22 is formed on the contact layer 19 and the insulating layer 20. After the n-side electrode 21 and the p-side electrode 22 are formed, the substrate 11 is adjusted to a given size, and the unshown reflector films are formed on the pair of resonator end faces opposed to each other in the length direction of the contact layer 19. Thereby, the laser diode 10 shown in FIG. 1 is formed.

In the laser diode 10, when a given voltage is applied between the n-side electrode 21 and the p-side electrode 22, a current confined by the contact layer 19, the third cladding layer 18, and the etching stop layer 17 is injected to the active layer 14, and light emission by electron-hole recombination is generated in the well layer 14A. Here, since the impurity concentrations of hydrogen and aluminum in the active layer 14 are in a given range, the operating current is inhibited from increasing, and the life is prolonged.

(Optical Module)

FIG. 7 shows a schematic view of a configuration example of an optical module including the foregoing laser diode 10.

An optical module 100 is used as, for example, an FEM (Front End Module) for transformation between optical signals and electric signals in the fast optical communication system. The optical module 100 includes a transmitter 110 and a receiver 120 on a substrate 101. Fibers 130 and 140 are respectively connected to the transmitter 110 and the receiver 120 through unshown connectors.

The transmitter 110 has, for example, the foregoing laser diode 10 and a driver 112 for driving the laser diode 10. As the driver 112, a known driver IC (Integrated Circuit) can be used.

The receiver 120 is a general receiver including, for example, a photoelectric transformation device (photo diode) 121 and an amplifier 122 such as a TIA (Trans Impedance Amplifier) and an LIA (Limiting Impedance Amplifier).

In the optical module 100, in the transmitter 110, the laser diode 10 is driven by the driver 112 based on an electric signal S1 supplied from outside, and an optical signal P1 is transmitted through the fiber 130. In the receiver 120, an optical signal P2 supplied through the fiber 140 approaches the photoelectric transformation device 121 and is transformed into an electric signal, the electric signal is amplified by the amplifier 122, is provided with necessary transformation process, and is output outside as an electric signal S2. Here, since the optical module 100 includes the laser diode 10 according to this embodiment, even if used for a long time, the operating current is inhibited from increasing, usage for a long time is enabled, and low electric power is realized.

As above, according to this embodiment, the impurity concentrations of hydrogen and aluminum in the active layer 14 are in a given range. Therefore, the operating current can be inhibited from increasing, and long life can be realized so that, for example, the elapsed time that the operating current is increased up to 50% or more of the initial operating current is 1000 hours or more.

In particular, when the thickness per one layer of the barrier layer 14B in the active layer 14 is in the range from 1 nm to 8 nm, the life can be further prolonged.

Further, if the flow rate of the organic nitrogen compound as a raw material of nitrogen is 135 cm$^3$/min or less when the active layer 14 is formed, the impurity concentration of hydrogen in the active layer 14 can be $3\times10^{19}$ cm$^{-3}$ or less. Therefore, the laser diode according to this embodiment can be easily manufactured.

Descriptions have been hereinbefore given of the present invention with reference to the embodiment. However, the present invention is not limited to the foregoing embodiment, and various modifications may be made. For example, in the foregoing embodiment, the semiconductor materials making up the laser diode 10 have been described with specific examples. However, other materials may be used. Further, in the foregoing embodiment, the case using the substrate 11 made of GaAs has been described. However, the substrate made of other material such as InP may be used.

Figure 9:
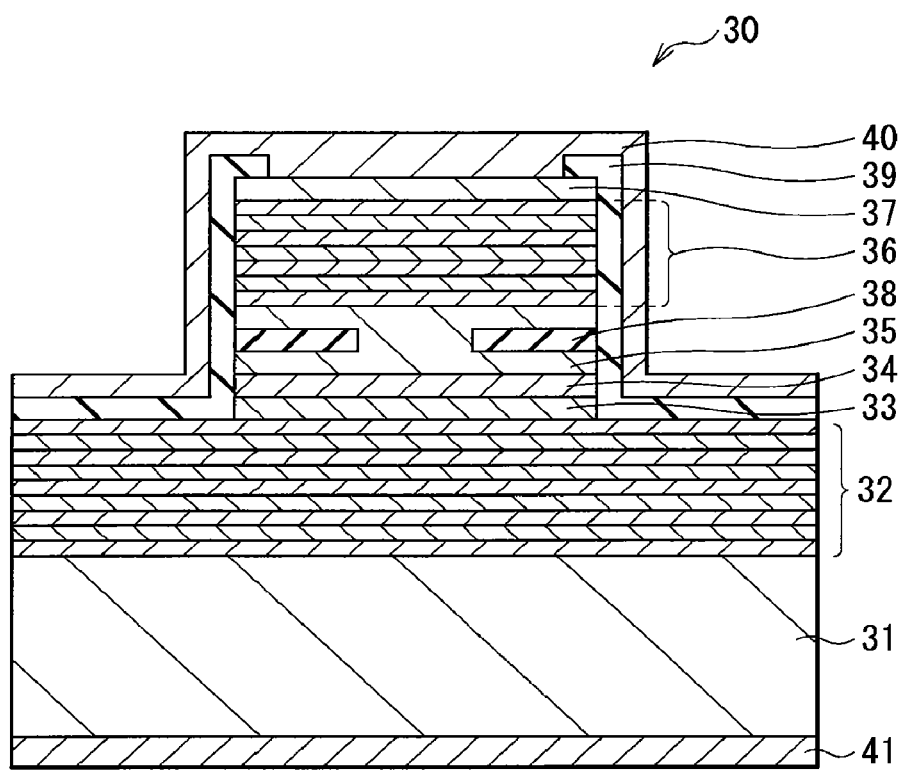
FIG. 9 is a cross section showing a structure of another laser diode of the present invention.

Further, while in the foregoing embodiment, the edge-emitting laser diode has been described as an example, the present invention can be similarly applied to a vertical cavity surface emitting laser diode. FIG. 9 shows a structural example thereof. In a laser diode 30, for example, on the obverse side of a substrate 31 made of n-type GaAs, an n-type multilayer reflector film 32 in which an n-type Al$_{0.9}$Ga$_{0.1}$As mixed crystal layer and an n-type GaAs layer are alternately layered, a first guide layer 33 made of undoped GaAs, an active layer 34, a second guide layer 35 made of undoped GaAs, a p-type multilayer reflector film 36 in which a p-type Al$_{0.9}$Ga$_{0.1}$As mixed crystal layer and a p-type GaAs layer are alternately layered, and a contact layer 37 made of p-type GaAs are layered sequentially, and a current confinement layer 38 made of an AlAs oxide layer is provided in the second guide layer 35. On the contact layer 37, a p-side electrode 40 is provided through the aperture provided in an insulating layer 39. On the reverse side of the substrate 31, an n-side electrode 41 is provided. The structure of the active layer 34 is similar to of the active layer 14 described in the foregoing embodiment.

In addition, in the foregoing embodiment, descriptions have been given of the case forming each semiconductor layer by MOCVD method. However, the present invention can be similarly applied to the case forming each semiconductor layer by other methods using gas as a raw material of a Group 15 element. As other methods, CBE (Chemical Beam Epitaxy) method can be cited.

Furthermore, in the foregoing embodiment, the configuration example of the optical module has been described. However, the optical module may have other configurations. For example, the optical module may be composed of only the transmitter 110.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a semiconductor light emitting device, in which an active layer has a well layer made of a compound semiconductor containing at least gallium (Ga), arsenic (As), and nitrogen (N), an organic nitrogen compound is used as a raw material of nitrogen when forming the active layer, the flow rate of the organic nitrogen compound is 135 cm$^3$/min or less, and thereby the impurity concentration of hydrogen (H) in the active layer becomes $3 \times 10^{19}$ cm$^{-3}$ or less.

2. The method of manufacturing a semiconductor light emitting device according to claim 1, wherein as a raw material of nitrogen, at least one from the group consisting of dimethyl hydrazine, monomethyl hydrazine, and tertiary butyl hydrazine is used.

3. The method of manufacturing a semiconductor light emitting device according to claim 1, wherein before forming the active layer, gas reactive with aluminum is flowed, and thereby the impurity concentration of aluminum (Al) in the active layer becomes $1 \times 10^{18}$ cm$^{-3}$ or less.

4. The method of manufacturing a semiconductor light emitting device according to claim 3 wherein as gas reactive with aluminum, at least one from the group consisting of dimethyl hydrazine, ammonia, and nitrogen radical is used.

5. A method of manufacturing a semiconductor light emitting device according to claim 3 wherein the gas reactive to aluminum is supplied together with a raw material of a Group 15 element in a state that supply of a raw material of a Group 13 element is stopped.

* * * * *